(12) United States Patent
Andriessen

(10) Patent No.: US 6,706,551 B2
(45) Date of Patent: Mar. 16, 2004

(54) THIN FILM INORGANIC LIGHT EMITTING DIODE

(75) Inventor: Hieronymus Andriessen, Beerse (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 10/054,243

(22) Filed: Jan. 24, 2002

(65) Prior Publication Data

US 2002/0151094 A1 Oct. 17, 2002

Related U.S. Application Data

(60) Provisional application No. 60/271,126, filed on Feb. 23, 2001.

(30) Foreign Application Priority Data

Feb. 7, 2001 (EP) .............................................. 01000007

(51) Int. Cl.$^7$ .............................................. H01L 51/40
(52) U.S. Cl. .............................. 438/99; 438/24; 438/29
(58) Field of Search .................. 438/99, 7, 24, 438/48, 29; 257/80, 40, 98, 102–103; 313/502–506; 427/66; 445/24; 117/68, 63

(56) References Cited

U.S. PATENT DOCUMENTS

| | | | |
|---|---|---|---|
| 5,073,303 A | * 12/1991 | Reid | 428/690 |
| 5,252,448 A | * 10/1993 | Nishio et al. | 445/24 |
| 5,422,489 A | * 6/1995 | Bhargava | 250/488.1 |
| 5,525,377 A | * 6/1996 | Gallagher et al. | 427/512 |
| 5,766,515 A | * 6/1998 | Jonas et al. | 252/500 |
| 5,946,550 A | * 8/1999 | Papadimitrakopoulos | 438/99 |
| 6,048,616 A | * 4/2000 | Gallagher et al. | 428/407 |
| 6,066,441 A | * 5/2000 | Jansen et al. | 430/440 |
| 6,083,635 A | * 7/2000 | Jonas et al. | 428/690 |
| 6,111,274 A | * 8/2000 | Arai | 257/96 |
| 6,160,273 A | * 12/2000 | Fork et al. | 257/98 |
| 6,241,819 B1 | * 6/2001 | Bhargava et al. | 117/68 |
| 6,379,583 B1 | * 4/2002 | Gray et al. | 252/301.4 R |
| 6,447,698 B1 | * 9/2002 | Ihara et al. | 252/301.36 |
| 2001/0039060 A1 | * 11/2001 | Siiman et al. | 257/80 |
| 2002/0110701 A1 | * 8/2002 | Wehrmann et al. | 428/690 |
| 2002/0149025 A1 | * 10/2002 | Andriessen et al. | 257/98 |
| 2002/0153830 A1 | * 10/2002 | Andriessen et al. | 313/498 |

FOREIGN PATENT DOCUMENTS

DE 198 12 258 A1 9/1999

OTHER PUBLICATIONS

European Search Report, Application No. 01 00 0007, Jun. 7, 2001.
Database WPI, Section Ch, Week 199950, Derwent Publications, Ltd., London, GB; AN 1999–586196 XP002168887 & JP 11 256150 A (Toshiba KK), Sep. 21, 1999, Abstract.
Bredol M et al: "ZnS Precipitation: Morphology Control" Journal of Materials Science, GB, Chapman and Hall LTD. London, vol. 33, No. 2, Jan. 15, 1998, pp. 471–476, XP000731083.
Li J. et al: "Nanosized Zinc Sulfide Obtained In The Presence Of Cationic Surfactants" Advanced Materials, DE VCH Verlagsgesellschaft, Weinheim, vol. 10, No. 12, Sep. 20, 1998, pp. 946–949, XP000781125.

* cited by examiner

Primary Examiner—Wael M Fahmy
Assistant Examiner—Thao X. Le
(74) Attorney, Agent, or Firm—Joseph T. Guy; Nexsen Pruet Jacobs & Pollard, LLC

(57) ABSTRACT

A method for the manufacturing of a Thin Film Inorganic Light Emitting Diode is disclosed. The device contains in one single layer or in a double layer a dispersion of zinc sulfide doped with a luminescent centre, and a water-compatible p-type semiconductive polymer, preferably a polythiophene/polymeric polyanion complex.

26 Claims, 2 Drawing Sheets

THIN FILM INORGANIC LIGHT EMITTING DIODE

This claims the benefit of provisional application Ser. No. 60/271,126, filed Feb. 23, 2001.

FIELD OF THE INVENTION

The present invention relates to a particular type of a Thin Film Inorganic Light Emitting Diode.

BACKGROUND OF THE INVENTION

At present several thin film electroluminescent devices (ELDs) exist or are still in development. They are all characterized by one (or more) electroluminescent active layer(s) sandwiched between two electrodes. Optionally a dielectric layer may also occur. The substrate can be plastic or glass.

The thin film ELDs can be subdivided into the organic and the inorganic based ELDs. The organic based thin film ELDs[1] are further subdivided into Organic molecular or Oligomeric Light Emitting Diodes (OLEDs) and Polymer Light Emitting Diodes (PLEDs). The inorganic ELDs on the other hand can be further subdivided into the High Voltage Alternating Current (HV-AC) ELDs and the Low Voltage Direct Current (LV-DC) ELDs. Amongst the HV-AC ELDs, one can distinguish Thin Film ElectroLuminescent Devices (TFEL devices or TFELDs) and Powder ELDs (PEL Devices or PELDs). Amongst LV-DC ELDs one can distinguish Powder ELDs (DC-PEL Devices or DC-PELDs) and thin film DC-ELDs, hereinafter called Inorganic Light Emitting Diodes (ILEDs).

The basic construction of organic ELDs (PLED and OLED) comprises following layer arrangement: a transparent substrate (glass or flexible plastic), a transparent conductor, e.g. Indium Tin Oxide (ITO), a hole transporting layer, a luminescent layer, and a second electrode, e.g. a Ca, Mg/Ag or Al/Li electrode. For OLEDs the hole transporting layer and the luminescent layer are 10–50 nm thick and applied by vacuum deposition; for PLEDs the hole transporting layer is 40 nm thick and the luminescent layer is 100 nm and applied by spin coating. Between both electrodes a direct voltage of 5–10 V is applied.

For OLEDs the hole transporting layer and electroluminescent layer consist of low molecular organic compounds, including oligomers. E.g. N,N'-diphenyl-1,1'-biphenyl-4,4'-diamine (TPD) can be used as hole transporter, and as electroluminescent compounds the aluminium (III) 8-hydroxyquinoline complex ($Alq_3$), polyaromatics (anthracene derivatives, perylene derivatives and stilbene derivatives) and polyhetero-aromatics (oxazoles, oxadiazoles, thiazoles etc.) can be used. The main advantages of these low molecular OLEDs include high fluorescent quantum yield, high purification and crystal growth capability and a wide selection of material design. Crystallisation of initially amorphous samples, production of exciplexes with other materials, and often high chemical reactivity create serious problems in their application to stable EL systems. Moreover, the layers are applied by using vacuum-vapour deposition techniques, which are often cumbersome and expensive. However, recently monochromic displays based on this principle are launched on the market by Pioneer[3].

On the other hand the electroluminescent compounds that can be used in PLEDs are polymers like the non-conjugated polyvinylcarbazole derivatives (PVK) or the conjugated polymers like poly(p-phenylene vinylenes) (PPV), poly(3-alkylothiophene, poly(p-phenylene ethynylenes) etc. These high molecular weight materials allow for the easy preparation of thin films by casting, and show a high resistance to crystallization. The difficulties in purifiation procedures (and hence reproducability) and, mostly, a low fluorescent quantum yield, in addition to a complex structure and high sensitivity towards oxygen and moisture are severe drawbacks in their application to organic ELDs.

As mentioned before, today, two kinds of HV-AC inorganic based ELDs exist[2]: PELDs and TFELDs. PEL Devices are used mainly for backlighting and low information content displays and can be manufactured on flexible substrates. TFEL devices are used for high information content matrix displays and can only be produced on glass substrates, due to the high processing temperature needed. Their basic structure is essentially the same. A PELD consists of a transparent substrate, a transparent conductor (ITO), a luminescent layer of doped ZnS (50 $\mu$m), an insulator/reflector layer (50 $\mu$m), and a top electrode, e.g. Ag-paste. Between both electrodes an alternating voltage of 110 V and 400 Hz is applied. A TFEL device consists of a transparent substrate, a transparent conductor, and a luminescent phosphor layer (0.6 $\mu$m) between two moisture protective insulator layers (0.6 $\mu$m), and a top electrode, e.g. evaporated metal. Between both electrodes an alternating voltage of 200 V and 400 Hz is applied.

For both devices, doped ZnS is used as the active luminescent layer. The doping centers (e.g., $Mn^{2+}$, $Cu^+$) can be excited by the impact of injected electrons by means of a high electric field or by transfer of recombination energy towards an electroluminescent centre. These excited centers relax to the ground state by a luminescence process. Several mechanisms for the electroluminescence process have been proposed[4]. The insulating layer for the PELD (screen printed $BaTiO_3$–powder+binder) fulfils three functions: (1) it prevents catastrophic breakdowns, (2) due to the high dielectric constant, the electric field will predominantly be focussed over the ZnS layer and (3) it will serve as diffuse light reflector, which increases the light output. For the TFEL device the vacuum deposited $Al_2O_3$ prevents also catastrophic breakdowns and it functions as tunnelling barrier for the electron injection. The structures are completed by two electrodes, one of which should be transparent.

For the PEL device, the ZnS layer comprises ZnS powder doped with copper ions and possibly other elements like chlorine and manganese mixed in an organic binder with a high dielectric constant like polyvinylidene fluoride or some kind of cyanoresin. The powders are prepared by high temperature sintering processes (>700° C.) in order to allow diffusion of the dopants into the ZnS crystal matrix and integration of $Cu_xS$-rich needles in- and outside the ZnS latice after cooling. For the HV-AC PELDs, the $Cu_xS$-needles at the surface are chemically removed by etching with cyanide ions. This to ensure electrical isolating particles. After that the particles are provided with a moisture protective layer like $Al_2O_3$ or NC (carbon-nitride) in order to increase the lifetime of the phosphor. The particle size of these powders varies between 2–20 $\mu$m. The dispersion of this powders can be used in a screen printing process in order to apply them in an electroluminescent layer with a thickness of 50–100 $\mu$m.

Upon applying an electric field on the phosphor particles, charges (e.g. electrons) are generated inside the particles at stacking faults in the ZnS latice and/or in the $Cu_xS$ needles. These charges can move according to the direction of the applied field (AC). By this way recombination processes can occur whereby the recombination energy can be transferred to an electroluminescent centre (e.g. $Cu^+$ or $Mn^{2+}$). Also direct impact excitation of the luminescence centre can occur if the kinetic energy of the electron is high enough (ca 4–5 eV). These processes can give rise to electroluminescence.

Electroluminescence occurs normally at field strengths in the order of 1–2 MV/cm. For a layer thickness of 100 μm, applying 110 V results in a mean value of the field strength of 50 kV/cm. The $Cu_xS$ needles at the interior of the ZnS-particles increase locally the electric field strength by a factor of 50 to 100 resulting in field strength values of up to 1 MV/cm, thereby making electroluminescence possible. The thick layer causes a slow luminance-voltage response, making PEL devices unsuitable for display applications.

General drawbacks of these PELDs are price (large amounts of products needed (about 150 g phosphor per square meter), the expensive $BaTiO_3$ layer, the high driving voltages (around 110 V) and their inherent instability. The latter is caused by the slow decrease in number of crystal stacking faults and $Cu_xS$ needles by applying an electric field (recrystallisation). The less stacking faults or $Cu_xS$ needles, the less charges (electrons) can be generated and hence a decrease in light output can be expected.

For the TFEL device, the doped ZnS layer is preferably deposited by using the Atomic Layer Epitaxy technology (Planar International), which also requires a high temperature sintering step, thereby limiting the substrates to glass substrates. The formed doped ZnS-layer is crystalline. This layer is sandwiched between two thin isolating $Al_2O_3$ layers. Upon applying a high voltage, typically between 150–200 V, tunneling of electrons occurs through these $Al_2O_3$ layers. Due to the high crystallinity of the ZnS layer, the electrons can travel freely under the influence of the applied electric field in this doped ZnS layer, thereby accumulating kinetic energy. At accumulation values of about 4–5 eV, impact excitation of the dopant can occur resulting in electroluminescence. The thin electroluminescent layer (1–1.5 μm) shows a treshhold behaviour of the luminance-voltage curve, making this TFEL device suitable for display applications.

General drawbacks of this system are the slow and expensive production process and the necessity of complete protection against ambient humidity.

Low voltage DC PEL Devices were developed by Vecht et al, as described by Chadha[5]. They used the same phosphor particles as for the AC-PELDs, but the conductive $Cu_xS$-needles at the surface are not removed. The general construction consists of a transparent substrate, a transparent conductor (ITO), a doped ZnS phosphor layer (20 μm), and a top electrode (evaporated Alu).

The phosphor layer is applied by means of the doctor blade technique or screen printing on an ITO conducting layer. Subsequently an Alu electrode is evaporated. Upon applying a direct current voltage of several volts (ITO positive), the p-conductive $Cu_xS$ starts moving towards the Alu electrode, thereby creating an insulating region (about 1 μm in thickness) next to the ITO layer within one minute or so. This results in a current drop which is associated with the onset of light emission. This process has been called the forming process. In this formed thin high resistive phosphor layer, high electric fields occur and electroluminescence is already possible at low voltages (typically between 10 and 30 V).

Major drawbacks of this system are the irreproducability of the forming process and the necessity of complete encapsulation against moisture. Also the preparation of the phosphor particles requires high sintering temperatures. No commercial devices based on this principle are on the market today.

Recently, several research groups reported photo-[7-13] and electroluminescence[14-18] from inorganic semiconducting nano particles.

Colvin et al.[14] reported on the electroluminescence of CdSe nano-particles stabilized by hexane dithiol. They demonstrated EL for two devices comprising a spincoated double layer of CdSe and PPV on ITO and covered it with an evaporated Mg electrode. Depending on the voltage they observed emission from the CdSe (lower voltages) or from the PPV (higher voltages).

Electroluminescence of CdSe quantum-dot/polymer composites was also reported by Dabbousi et al.[15]. They spincoated on ITO one single layer of CdSe nano-particles stabilized with trioctylphosphine oxide and mixed with a polymeric hole transporter (PVK) and an electron transport species (an oxadiazole derivative of PVK, t-Bu-PBD). An aluminum electrode was subsequently evaporated. The system showed electroluminescence in reverse bias, and depending on the applied voltage the emission spectrum of the CdSe quantumdots or PVK was observed.

Gao et al.[16] reported on the electroluminescence of self-assembled films of PPV and CdSe nano-particles. They could observe electroluminescence from the CdSe particles and/or from the PPV, depending on the applied voltage.

These examples demonstrate the possible use of inorganic nano-particles with semiconductor properties as Light Emitting Diodes (ILED), in analogy with the OLEDs. However, the use of Cd- or Se-compounds can not be recommended due to environmental problems that can be expected.

Huang et al.[17] reported the photo- and electroluminescence of a single layer of ZnS:Cu nanocrystals spincoated on a ITO substrate and evaporated with an aluminum electrode. ZnS and $Cu_xS$ are much more environmental friendly compared to CdSe. Also there was no need for organic hole or electron transporters, which can cause stability problems as is known in the organic PELDs. The drawback of their system lies in the fact that the synthesis of the ZnS:Cu particles is quite cumbersome and results in low yields. Polystyrene sulphonic acid is used as polyelectrolyte on which Zn and Cu ions are attached. Subsequently this polyelectrolyte is solved in dimethylformamide and reacted with $H_2S$. By this way $ZnS:C_xS$ particles are formed.

Que et al.[18] reported photo- and electroluminescence from a copper doped ZnS nanocrystals/polymer composite. The synthesis of the nano-particles was carried out by using the inverse microemulsion method. After washing and drying the ZnS:Cu powder was redispersed in MEK with PMMA as a binder and spincoated on ITO and evaporated with an aluminum electrode. Green electroluminescence could be observed in both bias directions at 5 V. The drawback of the fabrication of this device is the low concentrations of the ZnS:Cu dispersion that can be obtained (ca $10^{-3}$ M). Further it needs a well defined two phase system (soap/water). Also a drawback could be the solvent based spincoating dispersion.

References (1) Kalinowski J.; J. Phys. D: Appl. Phys. 32 (1999) R179–R250.
(2) De Visschere, 'Status of electroluminescent display technologies', Conference papers of ChemiChromics' 97, 1997
(3) http://www.pioneerelectronics.com (4) A. G. Fischer, J. Electrochemical Soc., (1963), Vol. 110, Nr. 7, 733–746.
(5) S. Chadha, Powder Electroluminescence, Solid State Lumin. (1993) 159–227
(6) Eshuis A.; van Elderen G. R. A.; Koning C. A. J.; Colloids and Surfaces A: Physicochemical and Engineering Aspects (1999), 151, 505–512.
(7) Gallagher, D.; Heady, W. E.; Racz, J. M.; Bhargava, R. N.; J. Mater. Res. (1995), 10(4), 870–6
(8) Murase, N.; Jagannathan, R.; Kanematsu, Y.; Watanabe, M.; Kurita, A.; Hirata, K.; Yazawa, T.; Kushida, T.; J. Phys. Chem. B (1999), 103(5), 754–760.
(9) Vacassy, Robert; Scholz, Stefan M.; Dutta, Joydeep; Plummer, Christopher John George; Houriet, Raymond; Hofmann, Heinrich; J. Am. Ceram. Soc. (1998), 81(10), 2699–2705.
(10) Yu, I.; Isobe T.; Senna M.; J. Phys. Chem. Solids (1996), 57(4), 373–379.
(11) Xu, S. J.; Chua, S. J.; Liu, B.; Gan, L. M.; Chew, C. H.; Xu, G. Q. Appl. Phys. Lett. (1998), 73(4), 478–480.
(12) Gan, L. M.; Liu, B.; Chew, C. H.; Xu, S. J.; Chua, S. J.; Loy, G. L.; Xu, G. Q.; Langmuir (1997), 13(24), 6427–6431.
(13) Leeb, J.; Gebhardt, V.; Mueller, G.; Haarer, D.; Su, D.; Giersig, M.; McMahon, G.; Spanhel, L. Institut fuer Silicatchemie, Universitaet Wuerzburg, Wuerzburg, Germany. J. Phys. Chem. B (1999), 103(37), 7839–7845.
(14) Colvin V. L., Schlamp M. C. & Alivisatos A. P., Nature (1994), Vol 370, 354–357.
(15) Dabbousi B. O., Bawendi M. G., Onitska O. and Rubner M. F., Appl. Phys. Lett. (1995) 66 (11) 1316–1318.
(16) Gao M., Richter B., Kirstein S. and Möhwald H., J. Phys. Chem. B (1998), 102, 4096–4103.
(17) Huang J., Yang Y., Xue S., Yang B., Liu S., Shen J. Appl/. Phys. Lett. (1997) 70(18), 2335–2337.
(18) Que, Wenxiu; Zhou, Y.; Lam, Y. L.; Chan, Y. C.; Kam, C. H.; Liu, B.; Gan, L. M.; Chew, C. H.; Xu, G. Q.; Chua, S. J.; Xu, S. J.; Mendis, F. V. C.; Appl. Phys. Lett. (1998), 73(19), 2727–2729.
(19) Rossetti R., Hull R., Gibson J. M., Brus L. E.; J. Phys. Chem. (1985), 82, 552–559.

The present invention extends the teachings on thin film electroluminescent devices.

OBJECTS OF THE INVENTION

It is the object of the present invention to provide an easy and economical method for the manufacturing of a Thin Film Inorganic Light Emitting Diode device capable of emitting light under the influence of direct current.

SUMMARY OF THE INVENTION

The above mentioned objects are realized by providing a method for manufacturing a Thin Film Inorganic Light Emitting Diode device, said method comprising the following steps, in order, (1) preparing a nanoparticle dispersion of ZnS doped with a luminescent centre by precipitation from appropriate aqueous solutions comprising zinc ions, sulfide ions and dopant ions,
(2) washing said dispersion of doped ZnS to remove non-precipitated ions, either,
(3) mixing said washed dispersion of doped ZnS (n-type semiconductor) with a water-compatible p-type semiconductive polymer,
(4) coating said mixture, optionally after admixture with a binder, onto a first conductive electrode,
(5) applying on top of said coated layer resulting from step (4) a second conductive electrode, with the proviso that at least one of said first and second electrode is transparent, or,
(3') coating on top of a first conductive electrode a double layer pack comprising, in either order,
(3'a) a layer containing a water-compatible p-type semiconductive polymer, and,
(3'b) a layer containing said washed dispersion of doped ZnS, optionally admixed with a binder,
(4') applying on top of said coated layer pack resulting from step (3') a second conductive electrode, with the proviso that at least one of said first and second electrode is transparent.

In a preferred embodiment the water-compatible p-type semiconductive polymer is a polythiophene/polymeric polyanion complex, most preferably a poly(3,4-ethylenedioxythiophene)/polystyrene sulphonate complex.

Preferred dopants for ZnS are manganese and copper ions.

BRIEF DESCRIPTION OF THE DRAWINGS

FIG. 1 illustrates the construction of an ILED device according to example 1.1 (see furtheron, two layer Light Emitting Diode).

DETAILED DESCRIPTION OF THE INVENTION

Figures 1A, 1E:
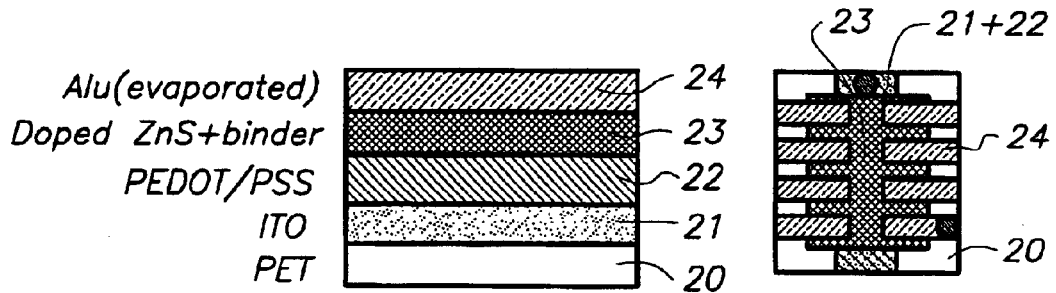
FIG. 1a represents the layer arrangement before patterning. It comprises a PET substrate 20, a first conductive ITO layer 21, a layer 22 containing a PEDOT/PSS complex (explained furtheron) a luminescent layer 23 based on doped ZnS, and a second electrode layer of evaporated aluminum 24.
FIG. 1e represents a top view of the complete patterned ILED. 31 represents a direct current-voltage source (I/V source) connected to the ITO electrode and the aluminum electrode via contact points 32 and 33.

The present invention will now be explained in detail on the hand of preferred embodiments. The two main components used in accordance with the present invention are doped zinc sulfide and a water-compatible p-type semiconductive polymer, preferably a polythiophene/polymeric polyanion complex. We will first explain the preparation of the doped ZnS.

In a particularly preferred embodiment zinc sulfide is doped with manganese luminescent centres. Such a ZnS:Mn nanoparticle dispersion is prepared by a precipitation reaction performed by mixing appropriate aqueous solutions of the respective ions. Preferably, the precipitation reaction is performed according to the double jet principle whereby a first and a second solution are added simultaneously to a third solution under controlled conditions of flow rate. For instance, the first solution contains zinc ions, e.g. zinc acetate, and manganese ions, e.g manganese acetate ions. The second solution contains sulfide ions, e.g. sodium sulfide ions. These two solutions are added together to a third aqueous solution. In a preferred embodiment one of the solutions, preferably the third, contains a triazole or diazole compound. A preferred triazole compound is 5-methyl-1,2,4-triazolo-(1,5-a)-pyrimidine-7-ol. It is believed that the presence of such a compound enhances the incorporation of the Mn$^{2+}$ dopant, and, as a result, the intensity of the luminescence.

The resulting nanoparticle dispersion, or predispersion as it will be called in the examples, has to be washed and concentrated. This is preferably done by a diafiltration and/or ultrafiltration treatment. The diafiltration and/or ultrafiltration is preferably performed in the presence of a compound capable of preventing agglomeration of nanoparticles. The nature of this compound is not restricted to a particular chemical class but can be chosen from various chemical types. Preferred compounds are polyphosphoric acid or a polyphosphate such as sodium polyphosphate, a hexametaphosphate such as sodium hexametaphosphate, and thioglycerol.

In a next step a surfactant may be added to the concentrated dispersion. Any of the numerous known surfactants can be used but a preferred product is a commercial saponine.

In another preferred embodiment the ZnS is doped with copper(I) or copper(II) ions. In this embodiment the precipitation is preferable performed in the presence of complexing agent such as EDTA or citrate.

Beside with manganese or copper the zinc sulfide can be doped with other luminescent centres such as Cu, Ag, Tb, Eu, Au, etc. The precipitation and and the washing steps are then similar to the ones described above for the ZnS:Mn dispersion.

The second essential ingredient used in accordance with the present invention is a water-compatible p-type semiconductive polymer. This type of ingredient will now be discussed in detail on the hand of the preferred embodiment wherein it is a polythiophene/polymeric polyanion complex.

The production of conductive polythiophenes is described in preparation literature mentioned in the book: "Science and Applications of Conducting Polymers", p. 92.

Preferably said polythiophene has thiophene nuclei substituted with at least one alkoxy group, or —O(CH$_2$CH$_2$O)$_n$ CH$_3$ group, n being 1 to 4, or, most preferably, thiophene nuclei that are ring closed over two oxygen atoms with an alkylene group including such group in substituted form.

Preferred polythiophenes for use according to the present invention are made up of structural units corresponding to the following general formula (I):

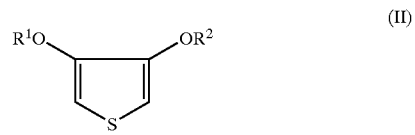
(I)

in which:
each of R$^1$ and R$^2$ independently represents hydrogen or a C$_{1-4}$ alkyl group or together represent an optionally substituted C$_{1-4}$ alkylene group or a cycloalkylene group, preferably an ethylene group, an optionally alkyl-substituted methylene group, an optionally C$_{1-2}$ alkyl- or phenyl-substituted 1,2-ethylene group, a 1,3-propylene group or a 1,2-cyclohexylene group.

The most preferred compound is poly(3,4-ethylenedioxythiophene), (PEDOT), with following formula Ibis:

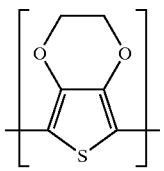
(Ibis)

The preparation of said polythiophene and of aqueous polythiophene-polymeric polyanion dispersions containing said polythiophene is described in published European patent application 0 440 957, cited above. The synthesis proceeds in the presence of said polymeric polyanion compounds by oxidative polymerization of 3,4-dialkoxythiophenes or 3,4-alkylenedioxythiophenes according to the following general formula (II):

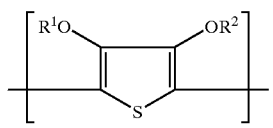
(II)

wherein:
R$^1$ and R$^2$ are as defined in general formula (I),
with oxidizing agents typically used for the oxidative polymerization of pyrrole and/or with oxygen or air in the presence of said polyacids, preferably in aqueous medium containing optionally a certain amount of organic solvents, at temperatures of 0 to 100° C.

The polythiophenes get positive charges by the oxidative polymerization, the location and number of said charges is not determinable with certainty and therefore they are not mentioned in the general formula of the repeating units of the polythiophene polymer.

Suitable polymeric polyanion compounds required for keeping said polythiophenes in dispersion are provided by acidic polymers in free acid or neutralized form. The acidic polymers are preferably polymeric carboxylic or sulphonic acids. Examples of such polymeric acids are polymers containing repeating units selected from the group consisting of acrylic acid, methacrylic acid, maleic acid, vinyl sulfonic acid and styrene sulfonic acid or mixtures thereof.

The anionic acidic polymers used in conjunction with the dispersed polythiophene polymer have preferably a content of anionic groups of more than 2% by weight with respect to said polymer compounds to ensure sufficient stability of the dispersion. Suitable acidic polymers or corresponding salts are described e.g. in DE-A-25 41 230, DE-A-25 41 274, DE-A-28 35 856, EP-A-14 921, EP-A-69 671, EP-A-130 115, U.S. Pat. Nos. 4,147,550, 4,388,403 and 5,006,451.

The polymeric polyanion compounds may consist of straight-chain, branched chain or crosslinked polymers. Cross-linked polymeric polyanion compounds with a high amount of acidic groups are swellable in water and are named microgels. Such microgels are disclosed e.g. in U.S. Pat. Nos. 4,301,240, 4,677,050 and 4,147,550.

The molecular weight of the polymeric polyanion compounds being polyacids is preferably in the range from 1,000 to 2,000,000 and more preferably in the range from 2,000 to 500,000. Polyacids within the above criteria are commercially available, for example polystyrene sulfonic acids and polyacrylic acids, or may be produced by known methods (ref. e.g. Houben-Weyl, Methoden der Organischen Chemie, Vol. E20, Makromolekulare Stoffe, Teil 2, (1987), pp. 141 et seq.).

Instead of the free polymeric polyacids applied in conjunction with the polythiophenes it is possible to use mixtures of alkali salts of said polyacids and non-neutralized polyacids, optionally in the presence of monoacids. Free acid groups of the polyanionic polymer may be allowed to react with an inorganic base, e.g. with sodium hydroxide, to obtain a neutral polymer dispersion before coating.

The weight ratio of polythiophene polymer to polymeric polyanion compound(s) can vary widely, for example from about 50/50 to 15/85.

The most preferred polymeric polyanion for use in combination with the polythiophene derivative, e.g. PEDOT, is polystyrene sulphonate (PSS).

Alternatives for polythiophene as water-compatible p-type semiconductive polymers, although not preferred, are e.g. polypyroles, polyanilines, sulphonated poly-p.-phenylenes, sulphonated polyfluorenes, polyphenylenevinylenes which can be carboxylated or sulphonated, polythienylenevinylenes which can be sulphonated or carboxylated. Optionally these polymers can also be used as complex with a polymeric polyanion, e.g. polystyrene sulphonate.

The essential ingredients used in accordance with the present invention being the doped ZnS dispersion and the water-compatible p-type semiconductive polymer, preferably a polythiophene/polymeric polyanion complex can be incorporated as luminescent layer or layer pack in an ILED. It is explicitly considered that an ILED manufactured in this way belongs to the scope of the present invention. The two ingredients can be incorporated in two essentially different ways. They can be mixed together and coated in just one layer. In an alternative embodiment the two ingredients are not mixed at all but are coated in two separate layers on top of each other in a double layer assemblage. In this case the layer containing the water-compatible polymer, e.g. the polythiophene/polymeric polyanion complex, is preferably applied on top of the first conductive electrode, and the doped ZnS layer is applied on top of the latter.

To the coating solutions of the mixture or to the coating solutions of the separate ingredients one or more binders may be added, although their presence is not essential.

Preferred binders are aqueous soluble polymers like polyvinyl alcohol (PVA) and polyvinyl pyrrolidone (PVP). Adding of these binders improves the stability of the dispersions.

The luminescent layer or layer pack is incorporated in an Inorganic Light Emitting Diode as follows (see illustration in FIG. 1, explained in the Examples section). The coating composition of the mixture, or the separate coating compositions is (are) coated on a patterned first conductive electrode. In a prefered embodiment this first conductive electrode is an ITO (Indium Tin Oxide) electrode. Thin transparent electrodes of evaporated Ag, Au, . . . can also be used. The transparent electrode is preferably applied on top of a plastic substrate, e.g. a polyester substrate such as a polyethylene terephthalate substrate, but a glass substrate can also be used. In case the top-electrode (second electrode) is transparent, a non-transparent electrode on glass or plastic can also be used (e.g. Al, Ca, Ag, Mg, Au, etc.) as first electrode. In a preferred alternative embodiment the first conductive electrode is a foil comprising a polythiophene/polyanion conductive complex. Preferably this complex is a poly(3,4-ethylenedioxythiophene)/polystyrene sulphonate complex. A foil comprising such a conductive complex is commercially available as ORGACON, (registered trade name of Agfa-Gevaert N. V.).

The composition(s) to be coated can be applied by any suitable coating technique. For the manufacturing of a small prototype spincoating is mostly preferred, but for larger areas doctor blade coating or continuous coating techniques such as used in photographic emulsion coating like air knife coating or curtain coating can be used. The obtained thickness of the dispersion layer(s) is dependent from the nature and concentration of the binder, and from the coating conditions. This thickness is preferably between 50 and 1000 nm. Finally, a second conductive electrode is applied on top of the coated layer. At least one of the conductive electrodes must be transparent. In a preferred embodiment the second conductive electrode is an aluminum electrode (cathode) applied by vacuum deposition. Also Ca, Mg, LiF/Al, Ag can be used. In case the bottom electrode used is non-transparent (Al, Ag, . . . ) a transparent electrode should be applied on top of the spincoated doped ZnS layer. This can be done by spincoating a PEDOT/PSS dispersion, or by sputtering an ITO layer on top of it, or by evaporation of a thin and transparent conductive metallic layer like Al, Ag, Au, . . .

When such a device is driven at different direct current bias voltages orange-yellow luminescence at 585 nm can be observed starting from a certain turn-on voltage, usually from 4 V on. In some cases diode behaviour together with electroluminescence in both bias directions is observed, as will be shown furtheron by the examples.

EXAMPLES

Example 1

Preparation of a ZnS:Mn Dispersion

The following solutions were prepared:

| Solution 1 | |
|---|---|
| Zn (acetate)$_2$ .2H$_2$O | 150.4 g |
| Mn (acetate)$_2$ .2H$_2$O | 4.85 g |
| Water | to 600 ml |
| Solution 2 | |
| Na$_2$S .9H$_2$O | 123.4 g |
| NaOH (50%) | 3.1 ml |
| Water | to 600 ml |
| Solution 3 | |
| 5-methyl-1,2,4-triazolo-(1,5-a)-pyrimidine-7-ol | 60 g |
| Water | to 800 ml |

To solution 3, stirred at 1500 rpm at 80° C., solutions 1 and 2, both held at room temperature, were added simultaneously at a flow rate of 500 ml/min. This results in a predispersion comprising ZnS:Mn—particles.

To 1000 ml of this predispersion, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of a diafiltration set-up to a concentration of about 35 g ZnS/l. Subsequently, 1 ml of a 12.5% solution of Saponine Quillaya (Schmittmann) in water/ethanol (80/20) solution per 20 ml dispersion was added. This is the final ZnS:Mn dispersion.

The dispersion was analysed for its particle size distribution with the Disc Centrifuge Photosedimentometer Brookhaven BI-DCP. A weight average particle size diameter of about 122 nm was obtained. Although particle sizes could be measured with DCP, no clear particles could be visualized by Electron Microscopy (SEM, TEM). The measured particle sizes are probably due (as revealed by EM images) to aggregates of nano-sized particles[6].

1.1 Two Layer Light Emitting Diode

A LED device according to FIG. 1 with the following layers was constructed. The layer arrangement is represented in FIG. 1a.

Figures 1B, 1C, 1D:
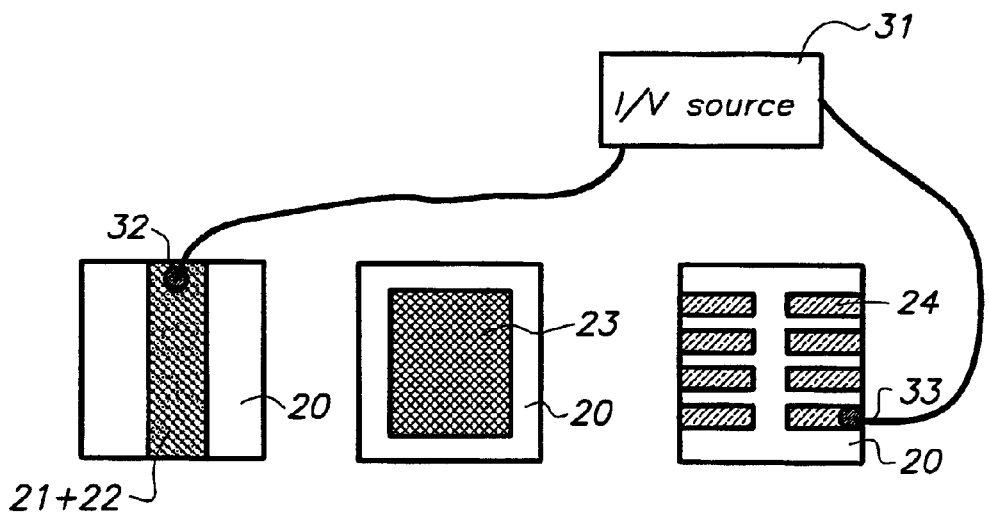
FIGS. 1b, 1c and 1d separately represent the patterning of the respective layers.

ITO (21) on a PET (20) substrate (175 μm) with a surface conductivity of about 80 Ohm/Sq was patterned. On the ITO, by using tape, a 1.2% PEDOT/PSSH—complex dispersion was spincoated (22). To 16.4 ml of the ZnS:Mn dispersion, 3.6 ml of a 5% polyvinylpyrrolidon (LUVISKOL K-90; BASF) was added. Subsequently, this dispersion was spincoated on the PET/ITO/PEDOT-PSS substrate (23). FIGS. 1b, 1c, 1d separately show the patterning of the different layers.

A 300 nm thick aluminum electrode (cathode) (24) was vacuum deposited on the spincoated ZnS:Mn/binder layer at $10^{-6}$ Torr by a mask. The emission area was 25 $mm^2$. FIG. 1e shows a top view of the complete patterned ILED.

The device was driven at different direct current bias voltages. Weak orange electroluminescence could be observed at a forward bias of 7 V.

1.2 One layer Light Emitting Diode

ITO on a PET substrate (175 μm) with a surface conductivity of about 80 Ohm/Sq was patterned. To 10.5 ml of the ZnS:Mn dispersion, 9.5 ml of a 1.2% PEDOT/PSSH—complex dispersion was added. This mixed dispersion was spincoated on the PET/ITO substrate. Subsequently, a 300 nm thick aluminum electrode (cathode) was vacuum deposited on the spincoated ZnS:Mn/PEDOT-PSSH layer at $10^{-6}$ Torr by a mask. The emission area was 25 $mm^2$.

Figure 2:
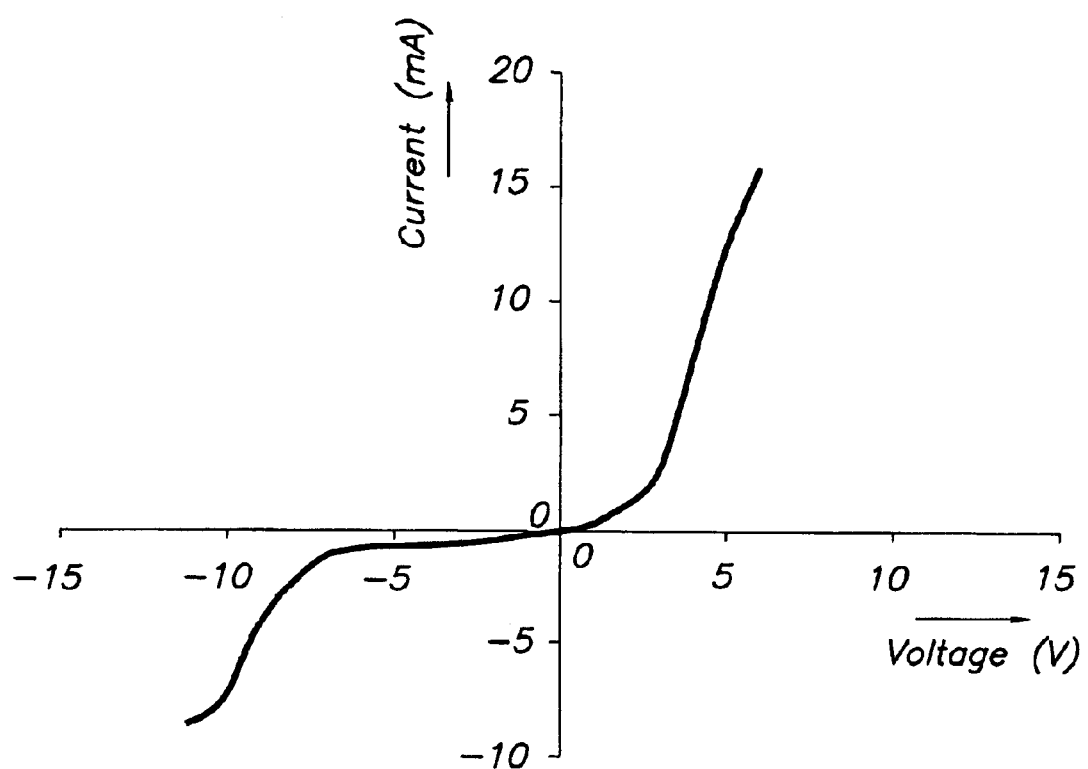
FIG. 2 represents the direct current-voltage curve (I/V curve) of an ILED constructed according to example 1.2 (one layer Light Emitting Diode).

At a forward bias orange electroluminescence could be observed from 4 V, and at reverse bias electroluminescence could be observed from −9 V. The I/V curve (double diode behaviour) is given in FIG. 2.

Example 2

Preparation of a ZnS:Cu Dispersion

The following solutions were prepared:

| Solution 4 | |
| --- | --- |
| Zn (acetate)$_2$ .2H$_2$O | 131.7 g |
| Cu (acetate)$_2$ .xH$_2$O | 55 mg |
| Water | to 600 ml |
| Solution 5 | |
| Na$_2$S .9H$_2$O | 112.2 g |
| NaOH (50%) | 3.6 ml |
| Water | to 600 ml |
| Solution 6 | |
| NaCl | 58.44 g |
| 1% of EDTA solution in water | to 1000 ml |

To solution 6, stirred at 1500 rpm at 80° C., solutions 4 and 5, both held at room temperature, were added simultaneously at a flow rate of 500 ml/min. This results in a predispersion comprising ZnS:Cu—particles.

To 1000 ml of this predispersion, 1000 ml of a 2% Na-polyphosphate solution in water was added and this dispersion was diafiltrated through a Fresenius F60 cartridge. The dispersion was concentrated to 1000 ml and washed at this level by using 6000 ml of a 2% solution of Na-polyphosphate in water.

After the washing, this dispersion was concentrated by means of a diafiltration set-up to a concentration of about 35 g ZnS/l. Subsequently, 1 ml of a 12.5% solution of Saponine Quillaya (Schmittmann) in water/ethanol (80/20) solution per 20 ml dispersion was added. This is the final ZnS:Cu dispersion.

The dispersion was analysed for its particle size distribution with the Disc Centrifuge Photosedimentometer Brookhaven BI-DCP. A weight average particle size diameter of about 75 nm was obtained.

2.1 Two layer Light Emitting Diode

A LED device according to FIG. 1 with the following layers was constructed: PET/ITO/PEDOT-PSS/ZnS:Cu/Alu.

ITO on a PET substrate (175 μm) with a surface conductivity of about 80 Ohm/Sq was patterned. On the ITO, by using tape, a 1.2% PEDOT/PSSH—complex dispersion was spincoated. To 16.4 ml of the ZnS:Cu dispersion, 3.6 ml of a 5% polyvinylpyrrolidon (LUVISKOL K-90; BASF) was added. Subsequently, this dispersion was spincoated on the PET/ITO/PEDOT-PSS substrate.

A 300 nm thick aluminum electrode (cathode) was vacuum deposited on the spincoated ZnS:Cu/binder layer at $10^{-6}$ Torr by a mask. The emission area was 25 $mm^2$.

The device was driven at different direct current bias voltages. Weak green electroluminescence could be observed at a forward bias of 7 V.

2.2 One layer Light Emitting Diode

ITO on a PET substrate (175 μm) with a surface conductivity of about 80 Ohm/Sq was patterned. To 10.5 ml of the ZnS:Cu dispersion, 9.5 ml of a 1.2% PEDOT/PSSH—complex dispersion was added. This mixed dispersion was spincoated on the PET/ITO substrate. Subsequently, a 300 nm thick aluminum electrode (cathode) was vacuum deposited on the spincoated ZnS:Cu/PEDOT-PSSH layer at $10^{-6}$ Torr by a mask. The emission area was 25 $mm^2$.

At a forward bias orange electroluminescence could be observed from 5 V.

What is claimed is:

1. A method for manufacturing a Thin Film Inorganic Light Emitting Diode device, said method comprising the following steps, in order:
   (1) preparing a nanoparticle dispersion of ZnS doped with a luminescent centre by precipitation from appropriate aqueous solutions comprising zinc ions, sulfide ions and dopant ions,
   (2) washing said dispersion of doped ZnS to remove non-precipitated ions, either,
   (3) mixing said washed dispersion of doped ZnS (n-type semiconductor) with a water-compatible p-type semiconductive polymer,
   (4) coating said mixture, optionally after admixture with a binder, onto a first conductive electrode,
   (5) applying on top of said coated layer resulting from step (4) a second conductive electrode, with the proviso that at least one of said first and second electrode is transparent, or,
   (3') coating on top of a first conductive electrode a double layer pack comprising, in either order,
   (3'a) a layer containing a water-compatible p-type semiconductive polymer, and,
   (3'b) a layer containing said washed dispersion of doped ZnS, optionally admixed with a binder,
   (4') applying on top of said coated layer pack resulting from step (3') a second conductive electrode, with the proviso that at least one of said first and second conductive electrode is transparent, thereby resulting in said Thin Film Inorganic Light Emitting Diode device.

2. A method according to claim 1 wherein said precipitation of step (1) is performed according to the double jet principle whereby a first solution containing zinc ions and a second solution containing sulfide ions are added together to a third solution.

3. A method according to claim 2 wherein said first solution also contains said dopant ions.

4. A method according to claim 1 wherein said dopant ions are manganese ions.

5. A method according to claim 1 wherein said dopant ions are copper (I) or copper (II) ions.

6. Method according to claim 1 wherein said washing of said dispersion of doped ZnS is performed by an ultrafiltration step, said ultrafiltration step and a diafiltration step, or said diafiltration step.

7. Method according to claim 6 wherein said ultrafiltration step, said ultrafiltration step and said diafiltration step, or said diafiltration step is (are) performed in the presence of a compound preventing agglomeration of nanoparticles.

8. A method according to claim 1 wherein said water-compatible p-type semiconductive polymer is a polythiophene/polymeric polyanion complex.

9. A method according to claim 8 wherein said polythiophene is poly (3,4-ethylenedioxythiophene).

10. A method according to claim 8 wherein said polymeric polyanion is polystyrene sulphonate.

11. A method according to claim 1 wherein said first electrode is an Indium Tin Oxide (ITO) electrode.

12. A method according to claim 1 wherein said second conductive electrode is an aluminum electrode applied by vacuum deposition.

13. A Thin Film Inorganic Light Emitting Diode device manufactured according to a method for manufacturing a Thin Film Inorganic Light Emitting Diode device, said method comprising the following steps, in order:

(1) preparing a nanoparticle dispersion of ZnS doped with a luminescent centre by precipitation from appropriate aqueous solutions comprising zinc ions, sulfide ions, and dopant ions, (2) washing said dispersion of doped ZnS to remove non-precipitated ions, (3) mixing said washed dispersion of doped ZnS (n-type semiconductor) with a water-compatible p-type semiconductive polymer, (4) coating said mixture, optionally after admixture with a binder, onto a first conductive electrode, (5) applying on top of said coated layer resulting from step (4) a second conductive electrode, with the proviso that at least one of said first and second conductive electrodes is transparent thereby resulting in said Thin Film Inorganic Light Emitting Diode device.

14. A method for manufacturing a Thin Film Inorganic Light Emitting Diode device, said method comprising the following steps, in order:

(1) preparing a nanoparticle dispersion of ZnS doped with a luminescent centre by precipitation from appropriate aqueous solutions comprising zinc ions, sulfide ions and dopant ions, (2) washing said dispersion of doped ZnS to remove non-precipitated ions, (3') coating on top of a first conductive layer a double layer pack comprising, in any order, (3'a) a layer containing a water-compatible p-type semiconductive polymer, and, (3'b) a layer containing said washed dispersion of doped ZnS, optionally admixed with a binder, (4') applying on top of said coated layer pack resulting from step (3') a second conductive electrode, with the proviso that at least one of said first and second conductive electrodes is transparent thereby resulting in said Thin Film Inorganic Light Emitting Diode device.

15. Method according to claim 14 wherein said precipitation of step (1) is performed according to the double jet principle whereby a first solution containing zinc ions and a second solution containing sulfide ions are added together to a third solution.

16. Method according to claim 15 wherein said first solution also contains said dopant ions.

17. Method according to claim 14 wherein said dopant ions are manganese ions.

18. Method according to claim 14 wherein said dopant ions are copper(I) or copper(II) ions.

19. Method according to claim 14 wherein said washing of said dispersion of doped ZnS is performed by an ultrafiltration step, an ultrafiltration step and a diafiltration step, or a diafiltration step.

20. Method according to claim 19 wherein said ultrafiltration step, said ultrafiltration step and said diafiltration step, or said diafiltration step is (are) performed in the presence of a compound preventing agglomeration of nanoparticles.

21. Method according to claim 14 wherein said water-compatible p-type semiconductive polymer is a polythiophene/polymeric polyanion complex.

22. Method according to claim 21 wherein said polythiophene is poly(3,4-ethylenedioxythiophene).

23. Method according to claim 21 wherein said polymeric polyanion is polystyrene sulphonate.

24. Method according to claim 14 wherein said first electrode is an Indium Tin Oxide (ITO) electrode.

25. Method according to claim 14 wherein said second conductive electrode is an aluminum electrode applied by vacuum deposition.

26. A Thin Film Inorganic Light Emitting Diode device manufactured according to a method for manufacturing a Thin Film Inorganic Light Emitting Diode device, said method comprising the following steps, in order:

(1) preparing a nanoparticle dispersion of ZnS doped with a luminescent centre by precipitation from appropriate aqueous solutions comprising zinc ions, sulfide ions and dopant ions, (2) washing said dispersion of doped ZnS to remove non-precipitated ions, (3') coating on top of a first conductive layer a double layer pack comprising, in any order, (3'a) a layer containing a water-compatible p-type semiconductive polymer, and, (3'b) a layer containing said washed dispersion of doped ZnS, optionally admixed with a binder, (4') applying on top of said coated layer pack resulting from step (3') a second conductive electrode, with the proviso that at least one of said first and second conductive electrodes is transparent thereby resulting in said Thin Film Inorganic Light Emitting Diode device.

* * * * *